United States Patent
Won et al.

(10) Patent No.: US 8,218,368 B2
(45) Date of Patent: Jul. 10, 2012

(54) SEMICONDUCTOR MEMORY DEVICE AND ERASE METHOD IN THE SAME

(75) Inventors: Sam Kyu Won, Yongin-si (KR); Jae Won Cha, Seoul (KR); In Ho Kang, Seoul (KR); Kwang Ho Baek, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 135 days.

(21) Appl. No.: 12/871,758

(22) Filed: Aug. 30, 2010

(65) Prior Publication Data

US 2010/0322004 A1 Dec. 23, 2010

Related U.S. Application Data

(62) Division of application No. 12/136,738, filed on Jun. 10, 2008, now Pat. No. 7,787,299.

(30) Foreign Application Priority Data

Mar. 14, 2008 (KR) .......................... 10-2008-0023837

(51) Int. Cl.
*G11C 16/06* (2006.01)

(52) U.S. Cl. ......... 365/185.25; 365/185.13; 365/158.17; 365/185.18; 365/185.22

(58) Field of Classification Search ............. 365/185.13, 365/185.17, 185.18, 185.22, 185.25
See application file for complete search history.

(56) References Cited

U.S. PATENT DOCUMENTS

2006/0028876 A1 * 2/2006 Quader et al. ........... 365/185.29
2007/0230253 A1 10/2007 Kim
2008/0130363 A1 6/2008 Hosono

FOREIGN PATENT DOCUMENTS

KR 1020030044618 A 6/2003

* cited by examiner

*Primary Examiner* — Hoai V Ho
(74) *Attorney, Agent, or Firm* — Kilpatrick Townsend & Stockton LLP

(57) ABSTRACT

A semiconductor memory device and an erase method in the same are disclosed. The semiconductor memory device includes a memory cell array configured to have a cell string in which memory cells are coupled, a block switch configured to switch a global word line and a word line of the memory cell array, a block decoder configured to control the block switch, and a recycle switch configured to use an erase voltage charged in a P-well of the memory cell array as a supply voltage of the block decoder.

5 Claims, 6 Drawing Sheets

SEMICONDUCTOR MEMORY DEVICE AND ERASE METHOD IN THE SAME

CROSS-REFERENCE TO RELATED APPLICATIONS

This application is a divisional of U.S. patent application Ser. No. 12/136,738, filed on Jun. 10, 2008, now issued as U.S. Pat. No. 7,787,299 which claims priority from Korean Patent Application No. 10-2008-0023837, filed on Mar. 14, 2008, the contents of which are incorporated herein by reference in their entirety.

BACKGROUND OF THE INVENTION

The present invention relates to a semiconductor memory device and more particularly, to an erase method in a flash memory device for reducing power consumption.

Generally, a flash memory device is divided into a NOR type flash memory device that provides high speed and a NAND type flash memory device that provides high storage capacity.

This flash memory device performs a read operation, a program operation and an erase operation. The program operation and the erase operation in the NAND type flash memory device are performed by utilizing Fowler-Nordheim (FN) tunneling of an insulating layer between a P-well and a floating gate of a memory cell by charged particles. The program operation of the flash memory device is performed by injecting electrons into the floating gate of the memory cell through FN tunneling. In the program operation, only selected memory cells in a memory cell block are programmed.

The erase operation in the flash memory device is performed by ejecting electrons from the floating gate of the memory cell to the P-well through FN tunneling. In the erase operation, data stored in all memory cells in a memory cell block are simultaneously erased. In other words, the erase operation is performed in units of blocks.

FIG. 1 is a flow chart illustrating a common erase process in the flash memory device.

At step 11, a pre-program is performed so as to ensure uniform an erase threshold voltage of memory cell.

At step 12, an erase operation is performed by applying an erase voltage to a P-well of a selected memory cell block.

At step 13, a verifying operation is performed to verify whether or not the memory cells in the selected memory cell block have been erased properly.

A determination is made as to whether or not the erase operation is a "pass" or a "fail" (step S14). The erase process is a "pass" if all the memory cells in the selected block have been erased. The erase process is a "fail" if not all the memory cells of the selected block have been erased.

At step 15, the erase process is a "pass," a soft program is performed. The soft program is performed to narrow the width of the threshold voltage distribution that has been scattered due to the erase operation performed at the step S12.

SUMMARY OF THE INVENTION

The present invention relates to a semiconductor memory device and an erase method which reuses electric charge applied to a P-well of a selected memory cell block in an erase operation when a following soft program is performed. As a result, efficiency of a high voltage pump for the soft program using a high voltage is enhanced, and so electric charge in the semiconductor memory device may be saved. In addition, current ICC provided to a chip in the erase operation may be reduced.

A semiconductor memory device according to one example embodiment of the present invention includes a memory cell array configured to have a cell string in which memory cells are coupled; a block switch configured to switch a global word line and a word line of the memory cell array; a block decoder configured to control the block switch; and a recycle switch configured to use an erase voltage charged in a P-well of the memory cell array as a supply voltage of the block decoder.

The supply voltage is precharged through the recycle switch, and then is pumped to a high voltage higher than a precharged voltage through a high voltage pump.

The semiconductor memory device further includes a high voltage pump coupled to a power supply line of the block decoder, and configured to pump the power supply line to a high voltage level through a pumping operation.

The recycle switch is coupled between the P-well and the power supply line, and controls the high voltage pump to perform initial pumping operation from a voltage higher than 0V.

A semiconductor memory device according to another example embodiment of the present invention includes a memory cell array configured to have a cell string in which memory cells are coupled; a global word line switch configured to couple a word line of the memory cell array to a select word line, or couple the word line of the memory cell array to a non-select word line; and a recycle switch configured to precharge the select word line or the non-select word line using an erase voltage charged to a P-well of the memory cell array.

The semiconductor memory device further includes high voltage pumps coupled to the select word line and the non-select word line, configured to apply an output voltage to the select word line and the non-select word line.

The recycle switch is coupled between the P-well and the select word line or the non-select word line, and controls the high voltage pumps to perform initial pumping operation from a voltage higher than 0V An erase method in a semiconductor memory device including a memory cell array having a cell string in which memory cells are coupled, a block switch for switching a global word line and a word line of the memory cell array, a block decoder for controlling the block switch, and a recycle switch for using an erase voltage charged in a P-well of the memory cell array as a supply voltage of the block decoder according to one example embodiment of the present invention includes erasing the memory cell array by applying the erase voltage to the P-well; using the erase voltage applied to the P-well as a supply voltage of the block decoder through the recycle switch; and performing an erase verifying operation after coupling the word line of the memory cell array to the global word line by using the block switch controlled by the block decoder.

The method further includes performing a soft program by applying a soft program voltage to the word line of the memory cell array after the erase verifying operation is performed.

An erase method in a semiconductor memory device including a memory cell array having a cell string in which memory cells are coupled, a global word line switch for coupling a word line of the memory cell array to a select word line, or couple the word line of the memory cell array to a non-select word line, and a recycle switch for precharging the select word line or the non-select word line using an erase voltage charged to a P-well of the memory cell array according to another example embodiment of the present invention includes erasing the memory cell array by applying the erase voltage to the P-well; reusing the erase voltage applied to the P-well as a voltage of the select word line or the non-select word line through the recycle switch; and coupling the word line of the memory cell array to the select word line or the non-select word line, and performing an erase verifying operation.

As described above, a semiconductor memory device and an erase method in the same of the present invention reuse electric charges of an erase voltage, applied to a P-well of a selected memory cell block in an erase operation, when following soft program is performed. As a result, efficiency of a high voltage pump for the soft program is enhanced, and so electric charges in the semiconductor memory device may be saved. In addition, current ICC provided to a chip in the erase operation may be reduced.

DESCRIPTION OF SPECIFIC EMBODIMENTS

Hereinafter, the embodiments of the present invention will be explained in more detail with reference to the accompanying drawings.

Figure 1:
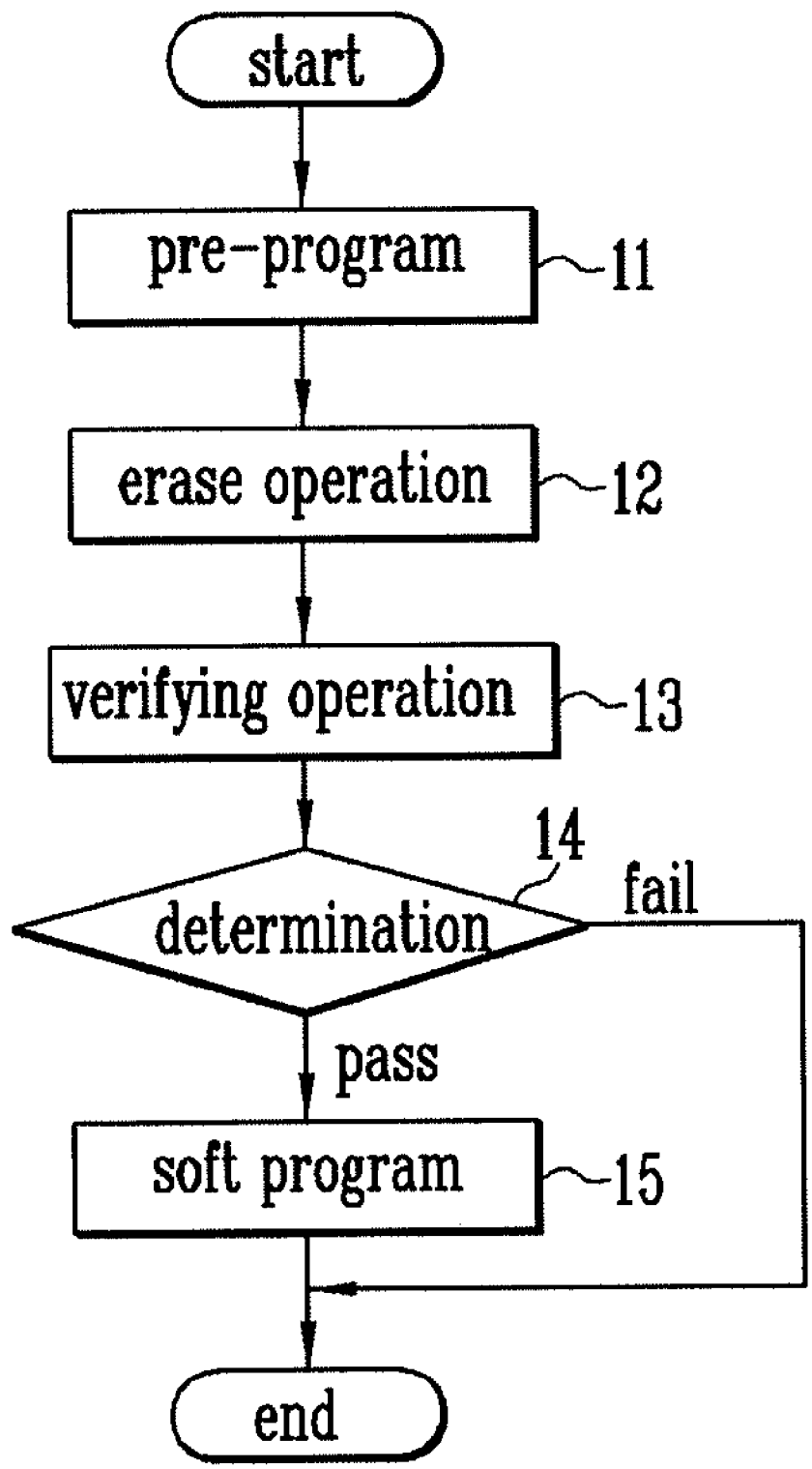
FIG. 1 is a flow chart illustrating a common erase process in a flash memory device.
Figure 2:
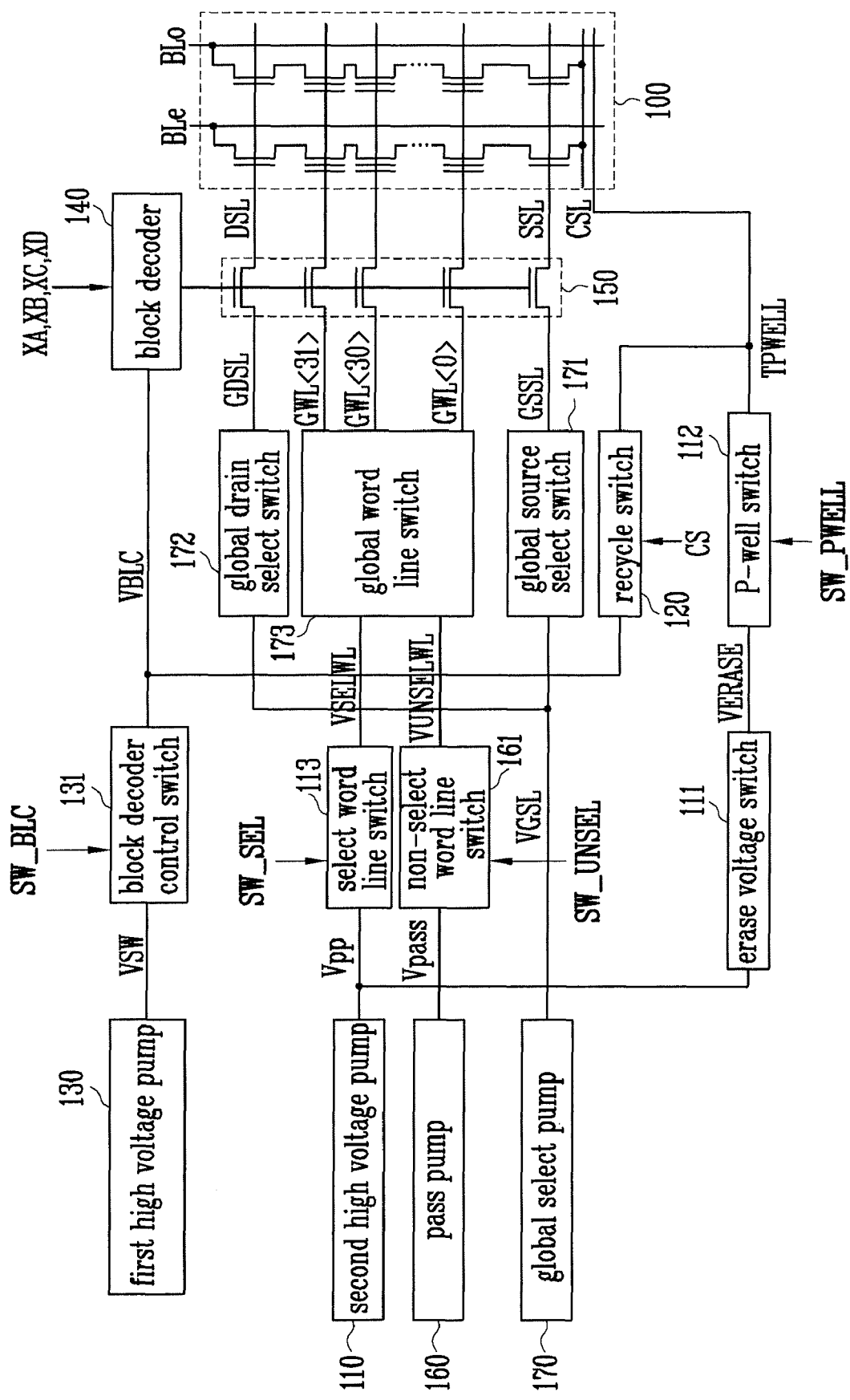
FIG. 2 is a view illustrating a semiconductor memory device according to one embodiment of the present invention.

FIG. 2 is a view illustrating a semiconductor memory device according to one embodiment of the present invention. The semiconductor memory device includes a memory cell block 100 having a plurality of cell strings. Each string has a plurality of memory cells connected in series. A block switch 150 couples global word lines GWL<0:31>, a global drain select line GDSL and a global source select line GSSL to the memory cell block 100. A block decoder 140 controls the block switch 150 in response to pre-decoding signals XA, XB, XC and XD. A first high voltage pump 130 generates a block select voltage VSW applied to the block decoder 140. A block decoder control switch 131 provides the block select voltage VSW to a block select node VBLC by switching the block select voltage VSW.

In addition, the semiconductor memory device further includes a second high voltage pump 110 for generating a high voltage Vpp. An erase voltage switch 111 outputs the high voltage Vpp as an erase voltage Verase by switching the high voltage Vpp in an erase operation. A P-well switch 112 applies the erase voltage Verase to a triple P-well TPWELL of the memory cell block 100. A recycle switch 120 provides electric charge in the triple P-well TPWELL to another location, e.g., the block select node VBLC.

Furthermore, the semiconductor memory device further includes a select word line switch 113 to output the high voltage Vpp as a select word line voltage VSELWL by switching the high voltage Vpp. A pass pump 160 generates a pass voltage Vpass. A non-select word line switch 161 outputs the pass voltage Vpass as a non-select word line voltage VUNSELWL by switching the pass voltage Vpass. A global word line switch 173 applies the select word line voltage VSELWL and the non-select word line voltage VUNSELWL to the global word lines GWL<0:31> by switching the word line voltages VSELWL and VUNSELWL. A global select pump 170 generates a global select line voltage VGSL. A global drain select switch 172 applies the global select line voltage VGSL to a global drain select line GDSL. A global source select switch 171 applies the global select line voltage VGSL to a global source select line GSSL.

Moreover, the semiconductor memory device further includes a page buffer which is coupled to an even bit line BLe and an odd bit line BLo of the memory cell block 100 and performs an erase verifying operation, a soft program verifying operation and a soft erase verifying operation.

Figure 3:
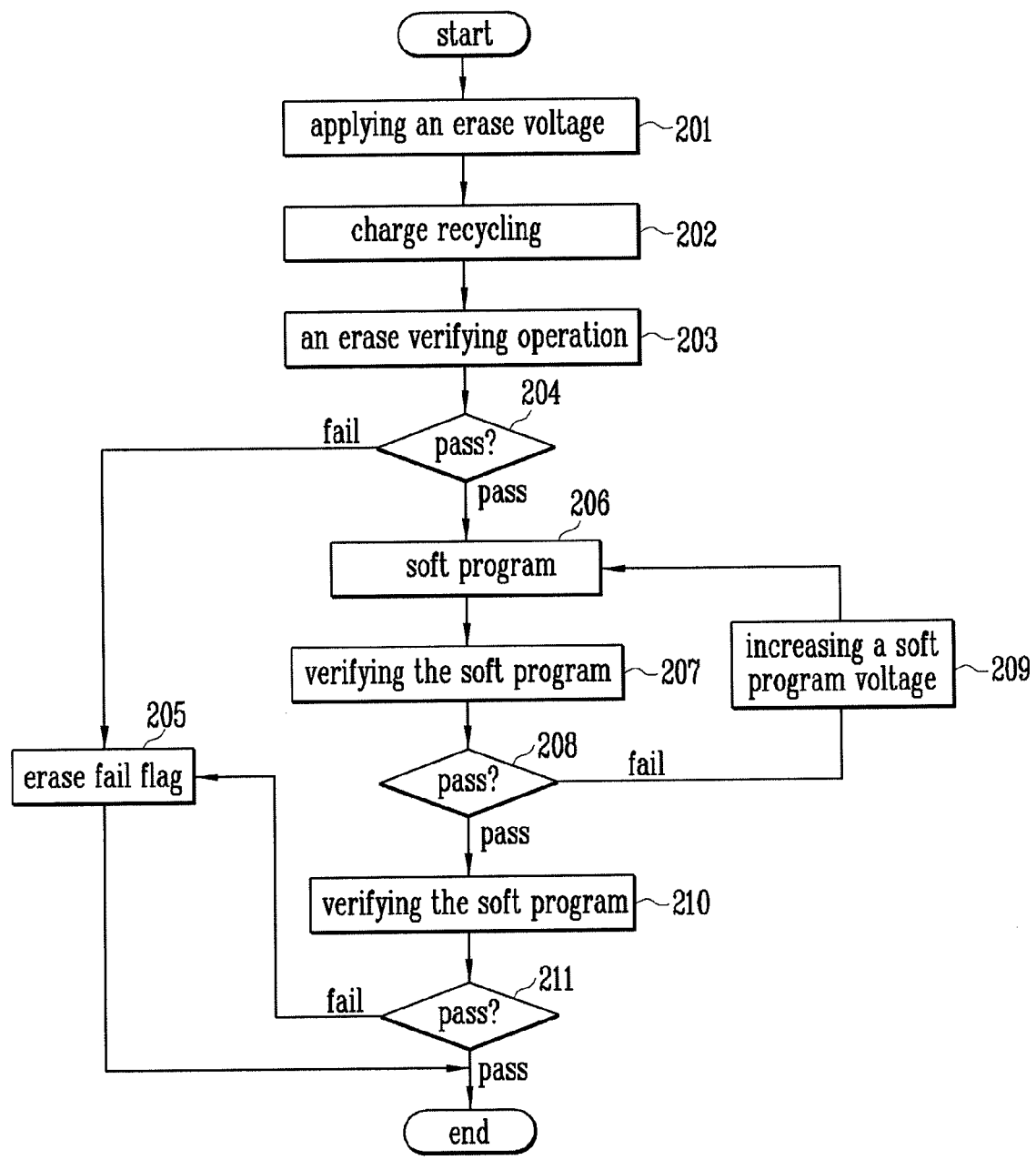
FIG. 3 is a flow chart illustrating an erase process in the semiconductor memory device according to one embodiment of the present invention.

FIG. 3 is a flow chart illustrating an erase process in the semiconductor memory device according to a first example embodiment of the present invention.

Figure 4:
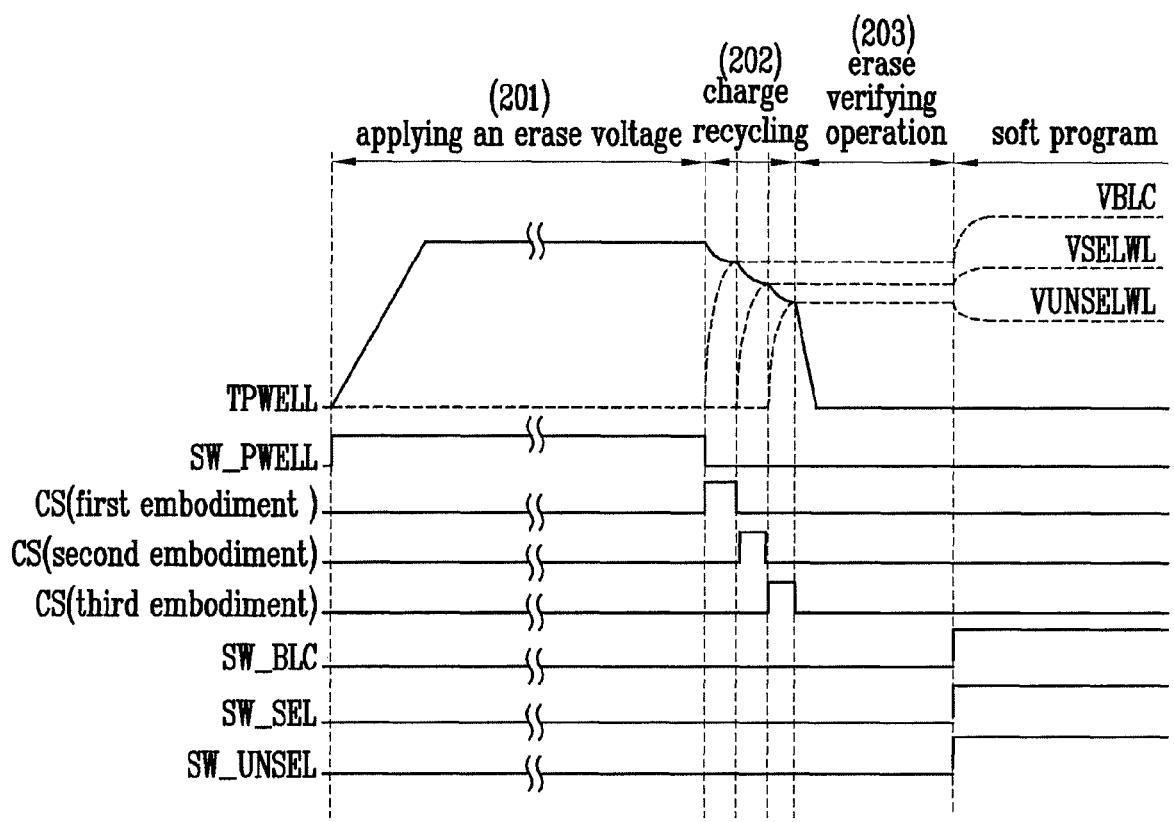
FIG. 4 is signal waveforms associated with embodiments of the present invention.

Hereinafter, the erase process in the semiconductor memory device will be described in detail with reference to FIG. 2, FIG. 3 and FIG. 4.

1) Applying an Erase Voltage in Step 201

The second high voltage pump 110 generates the high voltage Vpp by performing a charge pumping operation. Subsequently, the erase voltage switch 111 outputs the high voltage Vpp as the erase voltage Verase by switching the high voltage Vpp. The select word line switch 113 and the non-select word line switch 161 are disabled. The global word lines GWL<0:31> are discharged by coupling them to ground. The P-well switch 112 then applies the erase voltage Verase to a well (e.g., the triple P-well TPWELL) of the selected memory cell block 100 by switching the erase voltage Verase so as to perform the erase operation.

2) Charge Recycling in Step 202

The P-well switch 112 is disabled, and so the erase voltage Verase applied to the triple P-well is blocked. Subsequently, the recycle switch 120 is enabled, and thus the block select node VBLC is precharged by using electric charge in the triple P-well. The recycle switch 120 is disabled after the block select node VBLC has been precharged. Thereafter, Electric charge remaining in the triple P-well TPWELL is discharged through a ground.

3) Erase Verifying Operation in Step 203

The first high voltage pump 130 generates the block select voltage VSW, and the global select pump 170 generates the global select line voltage VGSL. In this case, the block decoder control switch 131 is enabled, and so an output node of the first high voltage pump 130 is coupled to the block select node VBLC. Here, since the block select node VBLC is precharged to a certain level by using electric charge from the triple P-well TPWELL, the first high voltage pump 130 may reach a target level voltage (approximately above 20V) through a pumping operation smaller than a pumping operation performed to reach the target level voltage from a ground level, i.e. 0V. As a result, power consumed is reduced.

The block decoder 140 provides the target level voltage to the block switch 150 in response to pre-decoding signal XA, XB, XC and XD for selection of the memory cell block 100.

The block switch 150 is enabled, thereby coupling the global word lines GWL<0:31>, the global drain select line GDSL and the global source select line GSSL to the memory cell block 100. In this case, the erase verifying voltage of 0V is applied to the global word lines GWL<0:31>, and a voltage having high level Vcc is provided to the global drain select line GDSL and the global source select line GSSL.

4) Determination in Step 204

Determination is made whether or not the memory cell block 100 is erased properly by using the page buffer coupled to the bit lines BLe and BLo of the memory cell block 100. If the number of memory cells that are not erased is equal to or more than a given value, the erase operation is determined to be a fail. An erase fail flag is generated at step 205.

5) Soft Program in Step 206

The soft program is performed to control the width of the threshold voltage distribution of the memory cells. The second high voltage pump 110 generates a soft program voltage and applies the generated soft program voltage to the global word lines GWL<0:31> through the select word line switch 113 and the global word line switch 173.

6) Verifying the Soft Program in Step 207

A soft program verifying voltage is applied to the global word lines GWL<0:31>, and then the threshold voltage distribution of the memory cells is measured.

7) Determination in Step 208

If the threshold voltage of at least one of the memory cells in the memory cell block 100 is higher than 0V, it is determined that the soft program is a pass. However, the threshold voltage of none memory cell in the memory cell block 100 is higher than 0V, the soft program voltage is increased, and then the soft program in step S206 is performed again.

8) Verifying Soft Erase in Step 211

A soft erase verifying operation is performed. If the threshold voltage distribution of the memory cells in the memory cell block 100 is higher than the target level voltage, it is determined that the soft erase operation is a pass. However, if the threshold voltage distribution is smaller than the target level voltage, the erase fail flag is generated in the step 205.

Figure 5:
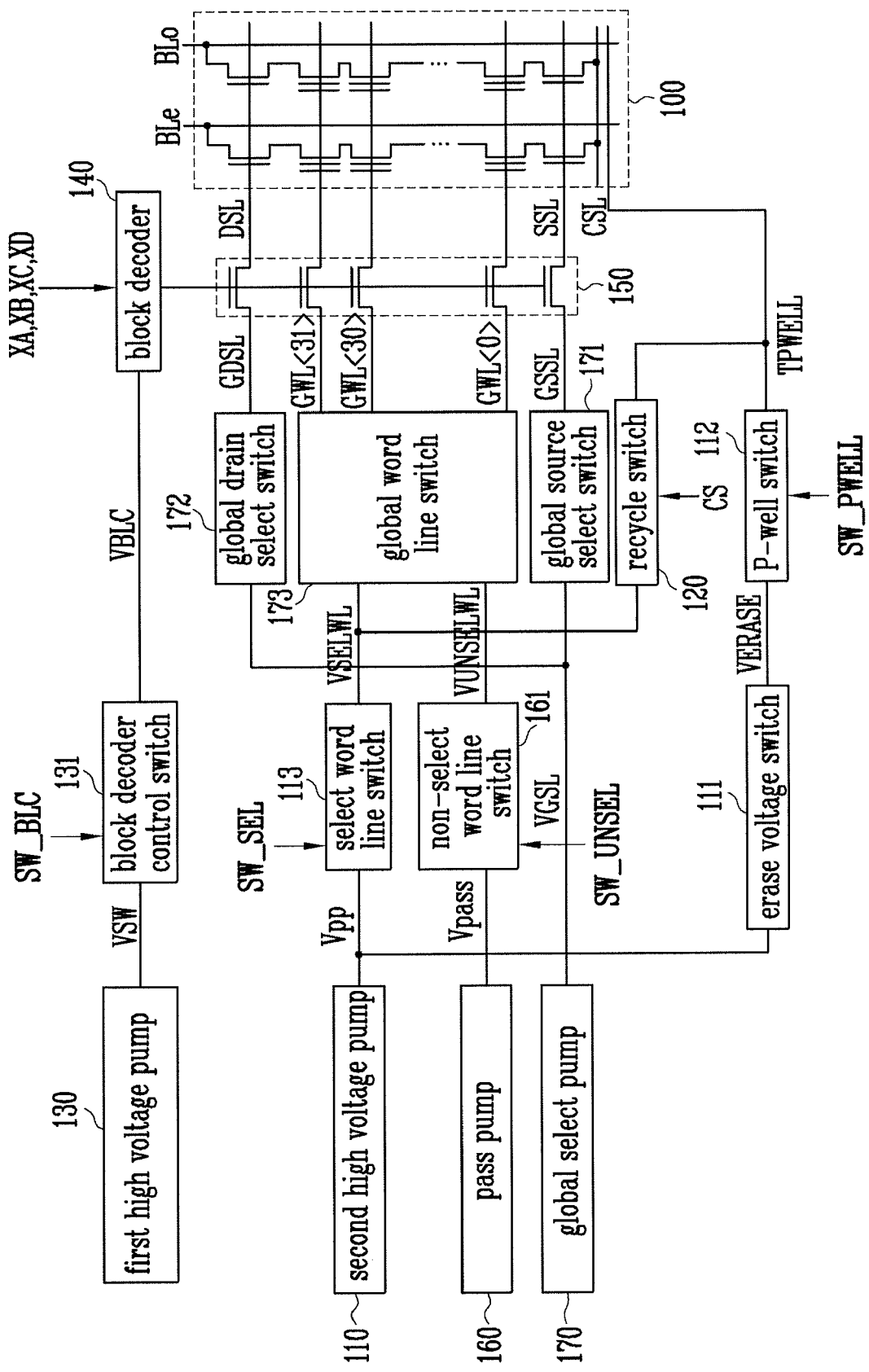
FIG. 5 is a view illustrating a semiconductor memory device according to another embodiment of the present invention.

FIG. 5 illustrates a semiconductor memory device according to another embodiment of the present invention. The memory device of FIG. 5 is similar to that of FIG. 2.

A recycle switch 120 is coupled to a selected word line VSELWL so that electric charges in a well, (e.g. a triple P-well TPWELL) are provided to the select word line VSELWL.

An erase operation in the semiconductor memory device of this embodiment is similar to that in the semiconductor memory device of FIG. 2.

Hereinafter, a charge recycling operation in step S202 will be described. A P-well switch 112 is disabled, and so an erase voltage Verase applied to the triple P-well TPWELL is blocked. Subsequently, the recycle switch 120 is enabled, and so the select word line VSELWL is precharged by using electric charge in the triple P-well TPWELL. The recycle switch 120 is disabled after the select word line VSELWL has been precharged.

The electric charge remaining in the triple P-well TPWELL is discharged through a ground. The operation above enables the select word line VSELWL to be precharged more easily during an erase operation. As a result, less power is consumed and the erase operation is performed more quickly.

Figure 6:
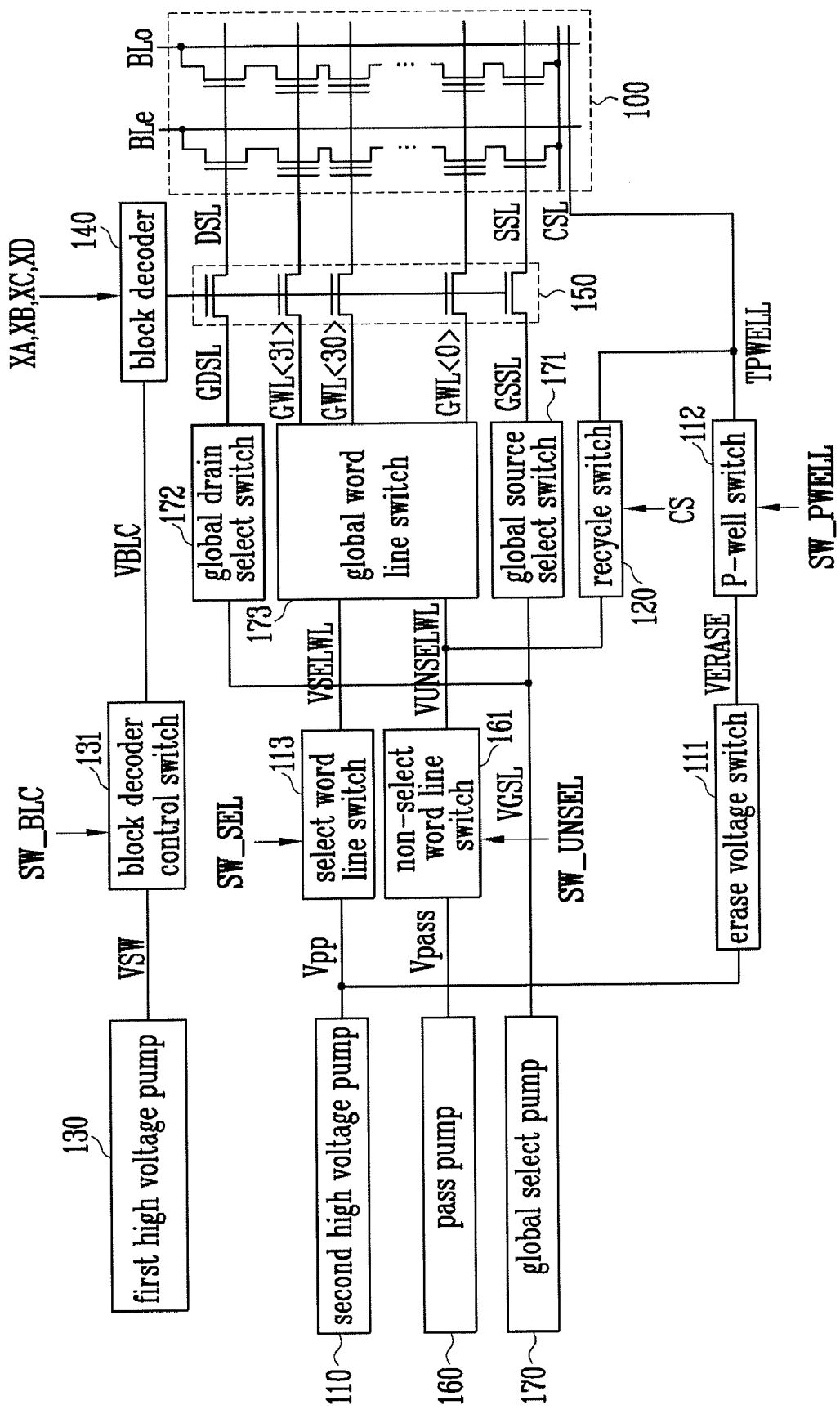
FIG. 6 is a view illustrating a semiconductor memory device according to yet another embodiment of the present invention.

FIG. 6 illustrates a semiconductor memory device according to yet another embodiment of the present invention. The memory device of FIG. 6 is similar to that of FIG. 2.

A recycle switch 120 is coupled to a non-select word line VUNSELWL so that electric charge in a triple P-well TPWELL is provided to the non-select word line VUNSELWL.

An erase operation in the semiconductor memory device of this embodiment is similar to that in the semiconductor memory device of FIG. 2.

Hereinafter, a charge recycling operation in step S202 will be described. A P-well switch 112 is disabled, and so an erase voltage Verase applied to the triple P-well TPWELL is blocked. Subsequently, the recycle switch 120 is enabled, and so the non-select word line VUNSELWL is precharged by using electric charge in the triple P-well TPWELL. The recycle switch 120 is disabled after the non-select word line VUNSELWL has been precharged. The electric charge remaining in the triple P-well TPWELL is discharged through a ground. The operation above enables the select word line VSELWL to be precharged more easily during an erase operation. As a result, less power is consumed and the erase operation is performed more quickly. The present embodiment enables the non-select word line VUNSELWL to be easily precharged. As a result, less power is consumed and the erase operation is performed more quickly.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor memory device comprising:
   a memory cell array having a plurality of cell strings, each cell string having a plurality of memory cells;
   a global word line switch configured to couple a word line of the memory cell array to a select word line, or couple the word line of the memory cell array to a non-select word line; and
   a recycle switch configured to precharge the select word line or the non-select word line using an erase voltage stored in a P-well of the memory cell array.

2. The semiconductor memory device of claim 1, further comprising:
   a first voltage pump coupled to the select word line and configured to apply an output voltage to the select word line; and
   a second voltage pump coupled to the non-select word line and configured to apply an output voltage to the non-select word line.

3. The semiconductor memory device of claim 2, wherein the first voltage pump is configured to output a high voltage Vpp and the second voltage pump is configured output a pass voltage Vpass.

4. The semiconductor memory device of claim 2, wherein the recycle switch is coupled between the P-well and the select word line or the non-select word line, and is configured to control the first and second voltage pumps to perform an initial pumping operation from a voltage higher than 0V.

5. An erase method in a semiconductor memory device including a memory cell array having a cell string including a plurality of memory cells, a global word line switch configured to couple a word line of the memory cell array to a select word line, or couple the word line of the memory cell array to a non-select word line, and a recycle switch configured to precharge the select word line or the non-select word line using an erase voltage stored in a well of the memory cell array, the method comprising:
- applying the erase voltage to the well to erase the memory cell array, the erase voltage being stored in the well;
- supplying the erase voltage stored in the well as a voltage of the select word line or the non-select word line through the recycle switch; and
- coupling the word line of the memory cell array to the select word line or the non-select word line, and performing an erase verify operation.

* * * * *